(12) United States Patent
Heringa et al.

(10) Patent No.: US 9,762,226 B2
(45) Date of Patent: Sep. 12, 2017

(54) SEMICONDUCTOR DEVICE HAVING CONTROL CONDUCTORS

(71) Applicant: Nexperia B.V., Eindhoven (NL)

(72) Inventors: Anco Heringa, Waalre (NL); Erwin Hijzen, Leuven (BE); Radu Surdeanu, Leuven (BE)

(73) Assignee: Nexperia B.V., Eindhoven (NL)

( * ) Notice: Subject to any disclaimer, the term of this patent is extended or adjusted under 35 U.S.C. 154(b) by 0 days.

(21) Appl. No.: 14/802,840

(22) Filed: Jul. 17, 2015

(65) Prior Publication Data

US 2016/0043708 A1 Feb. 11, 2016

(30) Foreign Application Priority Data

Aug. 5, 2014 (EP) .................................... 14179923

(51) Int. Cl.
*H03K 5/24* (2006.01)
*H01L 29/78* (2006.01)
(Continued)

(52) U.S. Cl.
CPC ....... *H03K 5/2472* (2013.01); *H01L 23/5226* (2013.01); *H01L 23/53271* (2013.01);
(Continued)

(58) Field of Classification Search
CPC H01L 27/1203; H01L 2924/00; H01L 21/845
See application file for complete search history.

(56) References Cited

U.S. PATENT DOCUMENTS

| 5,543,643 A | 8/1996 | Kapoor |
| 5,744,836 A | 4/1998 | Takahashi |

(Continued)

OTHER PUBLICATIONS

Gonzalez, F., Sr. et a. "A Dynamic Source-Drain Extension (DSDE) MOSFET Using a Separately Biased Conductive Spacer", Solid-State Electr., vol. 46, pp. 1525-1530 (2002).

(Continued)

*Primary Examiner* — Marc Armand
*Assistant Examiner* — Shannon Yi
(74) *Attorney, Agent, or Firm* — Ohlandt, Greeley, Ruggiero & Perle, L.L.P.

(57) ABSTRACT

A semiconductor device comprising: a substrate having: a first terminal region; a second terminal region; a first extension region that extends from the first terminal region towards the second terminal region; a second extension region that extends from the second terminal region towards the first terminal region; a channel region between the first and second extension regions; a gate conductor that overlies the channel region of the substrate, the gate conductor configured to control conduction in the channel region; a first control conductor that overlies at least a portion of the first extension region, the first control conductor configured to control conduction in the first extension region; and a second control conductor that overlies at least a portion of the second extension region, the second control conductor configured to control conduction in the second extension region, wherein the first and second control conductors are electrically isolated within the semiconductor device from the gate conductor.

18 Claims, 6 Drawing Sheets

(51) Int. Cl.
*H01L 23/522* (2006.01)
*H01L 23/532* (2006.01)
*H01L 29/06* (2006.01)
*H01L 29/08* (2006.01)
*H01L 29/45* (2006.01)
*H03K 17/687* (2006.01)

(52) U.S. Cl.
CPC ...... *H01L 29/0642* (2013.01); *H01L 29/0865* (2013.01); *H01L 29/0882* (2013.01); *H01L 29/45* (2013.01); *H01L 29/7816* (2013.01); *H01L 29/7831* (2013.01); *H01L 29/7833* (2013.01); *H01L 29/7836* (2013.01); *H03K 17/6871* (2013.01); *H01L 2924/0002* (2013.01)

(56) References Cited

U.S. PATENT DOCUMENTS

| | | | |
|---|---|---|---|
| 6,232,179 B1 * | 5/2001 | Sato | H01L 27/11521 257/320 |
| 6,661,057 B1 | 12/2003 | Dawson et al. | |
| 9,209,197 B2 * | 12/2015 | Ramsbey | H01L 29/42328 |
| 2002/0155664 A1 * | 10/2002 | Noro | H01L 27/115 438/263 |
| 2003/0031054 A1 * | 2/2003 | Lee | G11C 16/0483 365/185.17 |
| 2003/0198086 A1 * | 10/2003 | Shukuri | B82Y 10/00 365/185.18 |
| 2005/0230742 A1 * | 10/2005 | Matsuzawa | H01L 21/28273 257/315 |
| 2006/0065928 A1 | 3/2006 | Nagai | |
| 2007/0081391 A1 * | 4/2007 | Jeon | G11C 16/30 365/185.23 |
| 2009/0221124 A1 | 9/2009 | Yamauchi | |
| 2009/0244928 A1 | 10/2009 | Yang et al. | |
| 2011/0278675 A1 | 11/2011 | Masliah | |
| 2014/0152378 A1 * | 6/2014 | Yang | H02M 3/07 327/536 |
| 2014/0354609 A1 * | 12/2014 | Sawabe | G09G 3/3677 345/204 |
| 2015/0241464 A1 * | 8/2015 | Kaneko | G01L 5/0052 73/654 |
| 2015/0263022 A1 * | 9/2015 | Koyama | H01L 29/66825 257/316 |

OTHER PUBLICATIONS

Extended European Search Report for EP Patent Appln. No. 14179923.9 (Jan. 29, 2015).

* cited by examiner

SEMICONDUCTOR DEVICE HAVING CONTROL CONDUCTORS

CROSS-REFERENCE TO RELATED APPLICATIONS

This application claims the priority under 35 U.S.C. §119 of European patent application no. 14179923.9, filed on Aug. 5, 2014, the contents of which are incorporated by reference herein.

This disclosure relates to a semiconductor device such as an extended drain field effect transistor for use in e.g. a voltage converter.

According to a first aspect there is provided a semiconductor device comprising:
 a substrate having:
  a first terminal region;
  a second terminal region;
  a first extension region that extends from the first terminal region towards the second terminal region;
  a second extension region that extends from the second terminal region towards the first terminal region;
  a channel region between the first and second extension regions;
 a gate conductor that overlies, or extends along, the channel region of the substrate, the gate conductor configured to control conduction in the channel region;
 a first control conductor that overlies, or extends along, at least a portion of the first extension region, the first control conductor configured to control conduction in the first extension region; and
 a second control conductor that overlies, or extends along, at least a portion of the second extension region, the second control conductor configured to control conduction in the second extension region, wherein the first and second control conductors are electrically isolated within the semiconductor device from the gate conductor.

The first control conductor may be electrically isolated from the second control conductor within the semiconductor device. The first control conductor may be separate from, or contiguous with, the second control conductor. The first control conductor may be electrically isolated from the second control conductor. The first control conductor may be electrically isolated from the first terminal region within the semiconductor device. The second control conductor may be electrically isolated from the second terminal region within the semiconductor device.

The substrate may have a plane of symmetry. The substrate may have a plane of symmetry that passes through a centre of the channel region. The arrangement of the first extension region may mirror that of the second extension region. The dopant concentration of the first extension region may be similar to that of the second extension region. The dopant volume of the first extension region may be similar to that of the second extension region.

The gate conductor may overly the channel region. The gate conductor may overly a periphery of the first extension region. The gate conductor may overly a periphery of the second extension region. The gate conductor and the first and second control conductors may comprise the same material. The gate conductor and the first and second control conductors may be made of polysilicon or metal. The first and second control conductors may comprise a different material to the gate conductor.

The first and second control conductors may each include a polysilicon layer, a metal layer, and one or more vias connecting the polysilicon layer to the metal layer. The respective polysilicon layers may comprise upper portions of the first and second control conductors. The respective metal layers may comprise lower portions of the first and second control conductors. The polysilicon layer may at least partially overly the metal layer. The gate layer may be fully enclosed in an insulation layer. The metal layer of the field plate may be exposed at the surface of the insulation layer.

The semiconductor device may be a transistor. The transistor may be a field effect transistor.

According to a further aspect of the invention there is provided a circuit comprising:
 the semiconductor device of any preceding claim; and
 a driver circuit configured to provide:
  a first control voltage to the first control conductor;
  a second control voltage to the second control conductor; and
  a gate control voltage to the gate control conductor.

The first control voltage may be the same as the second control voltage. The first control voltage may be independent of the second control voltage.

The driver circuit may be further configured to set the first control voltage to be higher than the gate voltage during an on-state of the semiconductor device. The driver circuit may be further configured to set the first control voltage to one of (i) zero, (ii) a negative value or (iii) a lower voltage than the gate voltage during an off-state of the semiconductor device. The driver circuit may be further configured to set the second control voltage to one of (i) zero, (ii) a negative value or (iii) a lower voltage than the gate voltage during an off-state of the semiconductor device.

The driver circuit may comprise a gate steering logic circuit. The gate steering logic circuit may be configured to compare a first measured voltage at the first region of the semiconductor device with a second measured voltage at the second region of the semiconductor device. The gate steering logic circuit may be configured to determine a polarity of the device in accordance with the comparison. The polarity of the device may relate to which of the first and second control conductors is associated with a source extension region and which is associated with a drain extension region. The gate steering logic circuit may be configured to set control voltages for the first and second control conductors in accordance with a state of the device and/or the polarity of the device. The state of the device may be dependent on an input signal. For example, the driver circuit may be configured, in the off-state, to set a control voltage associated with the source region to be high and to set a control voltage associated with the drain side to be low or negative in order to provide a high reverse bias capability. The driver circuit may be configured, in the off-state, to set both the first and second control voltages high in order to provide a low reverse bias capability.

According to a further aspect of the invention there is provided a capacitive voltage converter comprising the semiconductor device or the circuit described above.

Also disclosed is a method of operating the semiconductor device described herein, the method comprising:
 providing a first control voltage to the first control conductor;
 providing a second control voltage to the second control conductor; and
 providing a gate control voltage to the gate control conductor.

The first control voltage may be the same as the second control voltage. The first control voltage may be independent of the second control voltage.

The method may comprise setting the first control voltage to be higher than the gate voltage during an on-state of the semiconductor device. The method may comprise setting the first control voltage to one of zero, negative or a lower voltage than the gate voltage during an off state of the semiconductor device.

The method may comprise comparing a first measured voltage at the first region of the semiconductor device with a second measured voltage at the second region of the semiconductor device. The method may further comprise determining a polarity of the device, based on which of the first and second control conductors is associated with a source extension region and which is associated with a drain extension region, in accordance with the comparison. The method may further comprise setting control voltages for the first and second control conductors in accordance with a state of the device. The method may further comprise setting control voltages for the first and second control conductors in accordance with the polarity of the device.

Embodiments of the invention will now be described by way of example, and with reference to the enclosed drawings in which.

In many applications of high voltage (HV) extended drain metal oxide semiconductor (EDMOS) devices it is desirable to have the option to exchange source and drain connections without degrading the capability of the device to handle high voltages (such as voltages in excess of 30 V). Interchangeable source and drain regions may be provided by a device in which there is a symmetry in the arrangement of source and drain regions.

Figure 1:
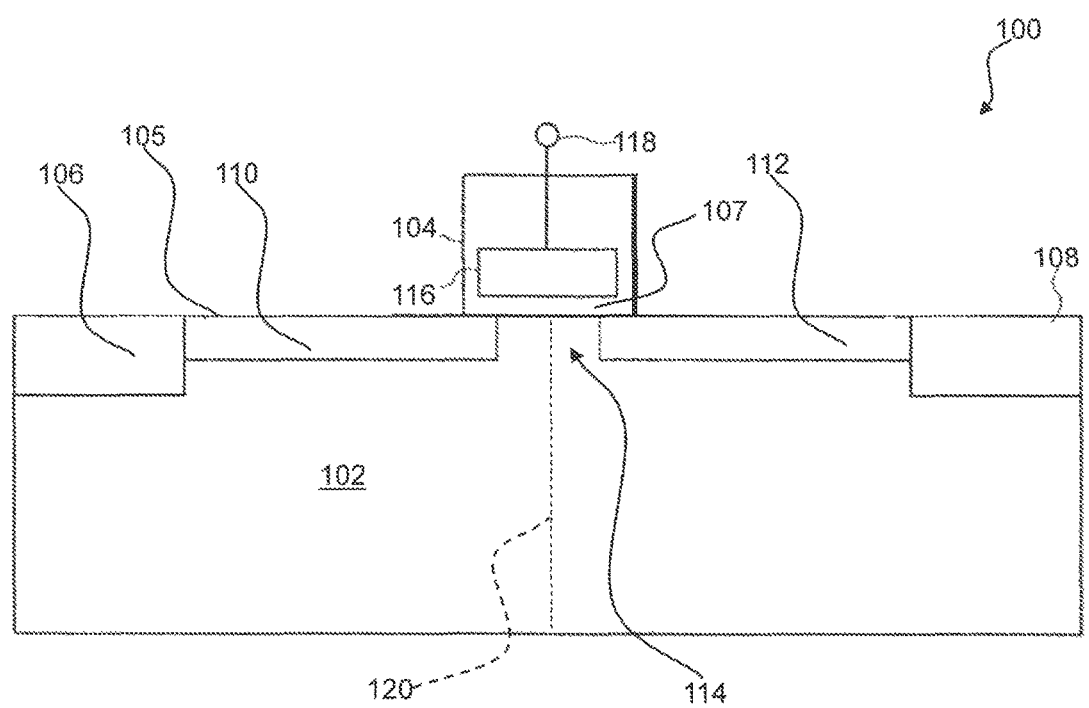
FIG. 1 illustrates a semiconductor device.

FIG. 1 illustrates a semiconductor device 100 that provides an extended drain metal-oxide field effect transistor (EDMOSFET). For example, the semiconductor device 100 may be a silicon on insulator (SOI) based transistor, a fin field effect transistor (FET), or a trench FET.

The field effect transistor of FIG. 1 comprises a substrate 102 and a terminal portion 104 provided on a (top) surface 105 of the substrate 102.

The substrate 102 has a first region 106 and a second region 108, both of which are adjacent to the surface 105 of the substrate 102. The first and second regions 106, 108 may also be referred to as first and second terminal regions. As discussed below, the first and second regions 106, 108 provide interchangeable source and drain regions, in this example. A first extension region 110 extends within the substrate 102 from the first region 106 towards the second region 108. A second extension region 112 extends within the substrate 102 from the second region 108 towards the first region 106. A channel region 114, is provided in the substrate 102 between the first and second extension regions 110, 112. That is, the channel region 114 can be located between a distal end of the first extension region 110 (distal with respect to the first region 106) and a distal end of the second extension region 112 (distal with respect to the second region 108).

The first and second extension regions 110, 112, which may also be referred to as drift regions, have a lower dopant concentration than the first and second terminal regions 106, 108. The difference in dopant concentration results in the extension regions 110, 112 having a higher resistivity (lower conductivity) than the corresponding first and second terminal regions 106, 108. A greater voltage is therefore dropped over each of the extension regions in an on state and a higher voltage can be withstood in an off state. The first and second regions 106, 108 and the first and second extension regions 110, 112 may be formed by conventional semiconductor processing techniques. For example, the regions 106, 108, 110, 112 can be created in the substrate 102 by appropriately implanted dopant.

Depending on the mode of operation of the semiconductor device 100, the first terminal region 106 and associated extension region 110 can provide either a source or a drain region. The second terminal region 108 and associated extension region 112 provides the other of the source and drain region. Of the first and second regions 106, 108, the region with the higher potential (more positive voltage for a p-type semiconductor or more negative for an n-type semiconductor) is considered to be the source and the other region is considered to be the drain.

The substrate 102 can have a plane of symmetry 120 through the channel region 114 in this example. The plane of symmetry is perpendicular to the surface 105 of the substrate 102. The symmetry is such that the first region 108 is mirror symmetric with the second region 108 and the first extension region 110 is mirror symmetric with the second extension region 112.

The terminal portion 104 may be a layer stack that includes multiple sub-layers. A gate conductor 116 is provided as a layer or plate in the terminal portion 104. The terminal portion 104 may also comprise insulating material. In this example the remainder of the terminal portion 104 comprises insulating material. The insulating material may be located on one or both of two opposing faces of the gate conductor 116 such that insulating material is located between the gate conductor 116 and the top surface 105 of the substrate 102.

A gate terminal 118 is electrically connected to the gate conductor 116 and is configured to receive a gate voltage from an external supply/component and provide that gate voltage to the gate conductor 116. A first terminal (not shown) for making an electrical connection to the first region 106 may also be provided, the first terminal may be a source or drain terminal. A second terminal (not shown) for making an electrical connection to the second region 108 may also be provided, the second terminal may be the other of the source and drain terminal.

The gate conductor 116 extends along the channel region 114 of the substrate 102 adjacent to the channel region 114 of the substrate 102. The gate conductor 116 is separated from the channel region 114 by a portion of insulating material, which in this example is a gate oxide layer 107 within the terminal portion 104. The gate conductor 116 may be considered to overlie the surface 105 of the substrate 102. The gate conductor 116 in the terminal portion 104 is therefore electrically isolated from the channel region 114 of the substrate 102 by the gate oxide layer. That is, the gate conductor 116 is not directly electrically connected to the channel region 114 and so substantially no current flows between the gate conductor 116 and the channel region 114.

However, the proximity of the gate conductor 116 to the channel region 114 is such that the gate conductor 116 is configured to control conduction in the channel region 114 using a field effect, as is known in the art.

In the example shown, the gate conductor 116 extends over the channel region 114 of the substrate and also over distal portions of the first extension region 110 and the second extension region 112. The distal portion of the first extension region 110 and the second extension region 112 are distal relative to their associated terminal regions 106, 108. Such an overlap of the gate conductor 116 and the extension regions 110, 112 enables a low resistance path to be provided between the extension regions 110, 112 due to the field effect. A portion of a periphery of the footprint (an edge) of the gate conductor 116 may be coterminous or may substantially correspond with a portion of a periphery of a footprint (an edge) of the channel region 114 when considered in the plane of the substrate (that is when viewed from above for the representation shown in FIG. 1).

A DC-DC converter is an example of an application for a symmetric semiconductor device. A large number of transistor switches and capacitances may be present in a capacitive voltage converter, which is a type of multi ratio DC-DC converter. The switches can either be switched 'on' or 'off' to load or unload a capacitor in the capacitive voltage converter. Each transistor switch can be either forward or reverse conducting, depending on the state of operation of the converter. A voltage across each transistor is dependent on the position of that particular transistor in the capacitive voltage converter arrangement. However, in some voltage converters all of the transistor switches may be driven by a single gate voltage that is referenced to the lowest voltage in the arrangement. When the lowest voltage is at the drain of a particular transistor, it can be difficult to switch on that transistor using an asymmetric device. It has been found that symmetric switch devices are advantageous in some DC-DC converter applications and may enable greater design freedom or improve circuit efficiency.

The high voltage capability of a semiconductor device may be implemented by providing a reduced dopant concentration in a drain extension region where the high voltage handling capability is required. The low doping part induces a high resistance. In a symmetric structure, such as the semiconductor device 100 of FIG. 1, a low dopant concentration extension region 110, 112 is provided extending from both terminals 106, 108 so that the drain is interchangeable with the source. Such an arrangement provides the required high voltage tolerant behaviour in applications in which the source and drain may be interchanged. However, providing a low dopant concentration region on both the source and drain sides can result in a substantial increase in the on-state resistance of the device compared to an asymmetric implementation in which the source side does not have a low dopant region.

FIGS. 2 to 6 illustrate various embodiments in which field plates are provided to control conduction in the first and second extension regions. The field plates are operable independently of the gate conductor. These embodiments relate to symmetric extended drain transistors with high voltage capability at source and drain side. In these embodiments, field plates are examples of control conductors which interact with the extension regions using the field effect in order to provide symmetrical semiconductor devices for handling high voltages with an improved on-resistance. The relatively low on-resistance may be obtained by reducing the resistance of at least the lowly doped extension region that is operating as the source. In some examples, the resistance of the drain region can be controlled independently of the source region and maintained at a required level.

The semiconductor devices of FIGS. 2 to 6 have all of the features of the device of FIG. 1, and in addition comprise two control conductors, which are described in relation to FIG. 2 below.

Figure 2:
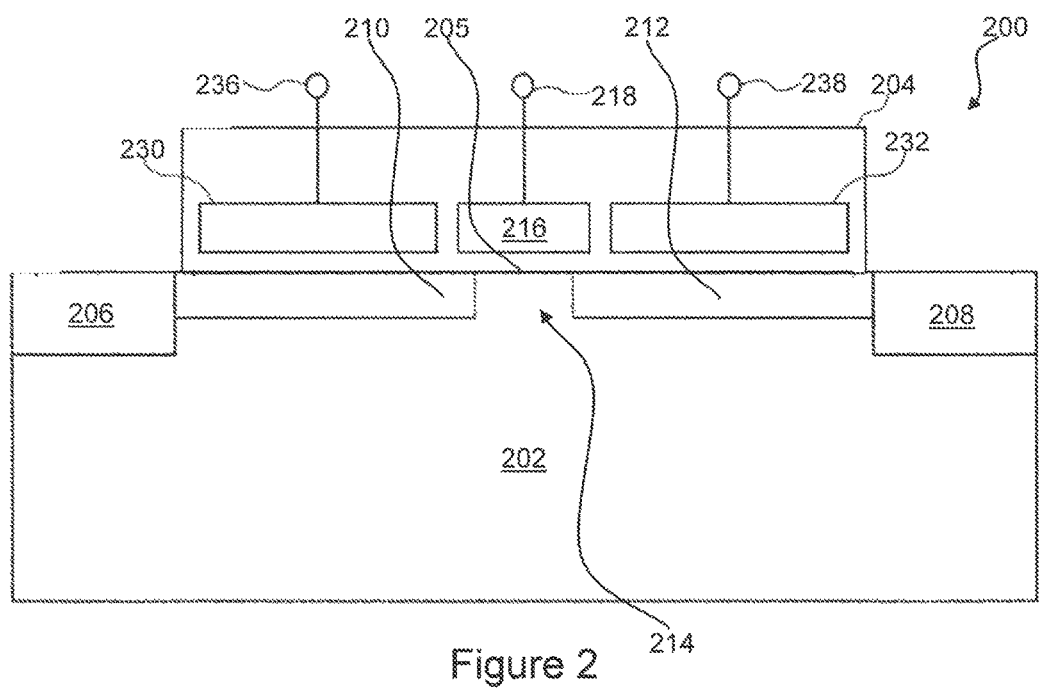
FIGS. 2 to 6 illustrate various semiconductor devices, each with two field plates in addition to a gate plate.

FIG. 2 illustrates a semiconductor device 200, which comprises a first field plate and a second field plate provided within a terminal portion 204. The terminal portion also comprises insulating material in a similar way to that described above with reference to FIG. 1. The terminal portion 204 can be considered to contain a stack of insulating layers (not individually shown) and plates. The first and second field plates are examples of first and second control conductors 230, 232.

The first control conductor 230 extends along, and is disposed vertically over or overlies, a portion of the first extension region 210 in the substrate 202. In this example, the first control conductor 230 is a plate that is parallel with the first extension region 210. Opposing edges of the first control conductor 230, where one of the edges faces the first region 206 and the other edge faces the channel region 214, are both within an extent/footprint of the first extension region 210. That is, all of the first control conductor 230 overlies, and is within the footprint of, the first extension region 210. First and second oxides layers (not shown) are also provided within the terminal portion 204 associated with the respective control conductors 230, 232. The first control conductor 230 is separated from the first extension region 210 by the first oxide layer and so the first control conductor 230 is electrically isolated, or insulated, from the first region 206 and the first extension region 210 in that they are not in direct electrical contact within the device 200. The first control conductor 230 is configured to control conduction in the first extension region using a field effect. A first control terminal 236 is electrically connected to the first control conductor 230 and is configured to receive a first control voltage from an external component/source and provide the first control voltage to the first control conductor 232.

The second control conductor 232 extends along, and is disposed vertically over or overlies, a portion of the second extension region in the substrate 202. In this example, the second control conductor 232 is a plate that is parallel with the second extension region 212. Opposing edges of the second control conductor 232, where one of the edges faces the second region 208 and the other edge faces the channel region 214, are both within an extent/footprint of the second extension region 212. That is, all of the second control conductor 232 overlies, and is within the footprint of, the first extension region 212. The second control conductor 232 is separated from the second extension region 212 by the second oxide layer and so the second control conductor 232 is electrically isolated, or insulated, from the second region 208 and the second extension region 212 in that they are not in direct electrical contact within the device 200. The second control conductor 232 is configured to control conduction in the second extension region 212 using a field effect. A second control terminal 238 is electrically connected to the second control conductor 232 and is configured to receive a second control voltage from an external component/source and provide the second control voltage to the second control conductor 232.

In this example, the first and second control conductors 230, 232 are provided in the same layer of material as the gate conductor 216. However, the first and second control conductors 230, 232 are electrically isolated from the gate conductor 216, and from each other, within the device 200. In this way, the first and second control conductors 230, 232 and the gate conductor 216 may each be independently supplied with different bias voltages. A voltage may be applied to one of the first and second control conductors 230, 232 independently from voltages applied at the first and second regions 206, 208 and the gate conductor 216. That is, application of a voltage at the first and second control conductors 230, 232 does not cause a change in the voltages at the first and second regions 206, 208 due to, for example, small currents leaking through the first and second oxide layers. This is because the first and second oxide layers provide insulation within the terminal portion 204 between the first and second control conductors 230, 232 and the respective first and second regions 206, 208. In some implementations, there may be some leakage current from the first and second control conductors 230, 232 to the gate conductor 216 through insulation within the terminal portion 204 between the first and second control conductors 230, 232 and the gate conductor 216. However, in these examples, the voltage may still be considered as being applied to the first or second control conductor 230, 232 independently from the voltages applied at the first and second regions 206, 208 and the gate conductor 216. Because a voltage can be applied to the first and second control conductors 230, 232 independently from the voltages applied to the first and second regions 206, 208 and the gate conductor 216, the voltages applied to each of the first and second control conductors 230, 232 can be higher or lower than the voltage applied to the gate conductor 216. Consequently, a doping level in the first and second extension regions 230, 232 may be increased so that the on-resistance of the device can be reduced without degrading the reverse bias withstand capability.

The drift resistance of the semiconductor device 200 is determined by the drift doping concentration of the semiconductor device 200. Generally, in order to have a high breakdown voltage, the drift doping concentration of a semiconductor device has to be low. However, such a low doping induces a high on-state resistance. Because the doping level in the first and second extension regions 230, 232 (which provide the source and drain drift regions) can be made higher, the on-state resistance of the semiconductor device 200 can be lowered without degrading its breakdown voltage. The semiconductor device 200 may be referred to as a "boost-transistor" because of the selectable, increased conductivity in the source and drain extension regions and the associated improvement of the on-state resistance.

By applying appropriate voltages to the first or second control conductor 230, 232 in the on-state and in the off-state, the on-resistance of the semiconductor device 200 can be reduced to a substantially lower level.

In the on-state of the semiconductor device 200, the gate conductor 216 is switched on by applying a voltage to it. This enables current to flow between the first region 206 and the second region 208 through the first and second extension regions 210, 212 and the channel region 214. A significant part of the on-state resistance of the semiconductor device 200 is caused by the extension regions 210, 212. By applying a voltage to the control conductor that is adjacent to the extension region, the field effect can be used to decrease the resistance associated with the extension region in the on-state. The first or second control conductor 230, 232 may therefore be used as an active part of the semiconductor device 200 to decrease the on-resistance of the semiconductor device. In particular, in the on-state, by putting a high voltage on whichever of the first and second control conductor 230, 232 that is over the extension region an accumulation layer will be formed in the corresponding extension region that lowers the on-resistance. The voltage applied to the first or second control conductor 230, 232 in the on-state may be higher than the voltage applied to the gate conductor 216 in the on-state.

By switching off the voltage on the first or second control conductor 230, 232 and providing a low or zero voltage at the gate conductor 216, the semiconductor device 200 goes into an off-state. In the off-state of the semiconductor device 200, no current flows between the first and second regions 206, 208 because the gate is switched off. The first or second control conductor 230, 232 may be grounded or connected to a negative voltage during the off state of the semiconductor device 200. By grounding the first or second control conductor 230, 232 during the off-state of the semiconductor device 200, the drain extension region can be more easily depleted in the off-state and high voltages can still be supported by the semiconductor device 200 at higher drain extension doping.

If a negative voltage is applied to the first or second control conductor 230, 232 in the off-state, a still higher doping concentration may be used in the drain extension region to lower the on-state resistance. The level of the negative voltage applied to the first or second control conductor 230, 232 in the off state depends on the thickness of the insulation layer between control conductors 230, 232 and the extension regions 210, 212. The negative voltage applied to the first or second control conductor 230, 232 in the off state can be, for example, up to −300 Volt/micron of insulator thickness. For example, the voltage applied to the first or second control conductor 230, 232 in the off state can be −30 V at an insulator thickness of 100 nm.

By applying appropriate voltages to the control conductors 230, 232, the device can be controlled such that (i) the source side extension is made low-ohmic by applying a high voltage to the field plate (at the "source" side); (ii) the drain side extension is made low-ohmic by applying a high voltage to the field plate (at the "drain" side); or (iii) both the source side extension and the drain side extension are made low-ohmic by biasing both field plates high.

In an exemplary scheme for operating the semiconductor device 200, during the on-state:
  a positive gate voltage is applied to the gate conductor 216 through the gate voltage terminal 218;
  a positive control voltage, which is larger than the gate voltage, is applied to the control conductor 230, 232 associated with the source region; and
  a negative voltage or a ground voltage is applied to the control conductor 230, 232 associated with the drain region.

In this scheme, the biasing of the control conductors 230, 232 is such that the source is biased high (making the source extension low-ohmic) and the drain is biased low (and can still withstand a high voltage). In this example the first control conductor 230 may be electrically isolated from the second control conductor 232 within the semiconductor device 200 in order that the control conductors 230, 232 can be operated independently of one another.

During the off-state, the gate conductor 216 and the first and second control conductors 230, 232 are grounded or connected to a negative voltage. It will be appreciated that the terms positive and negative may be reversed, depending on the polarity of the semiconductor device 200 and may be referred to as a first polarity and a second polarity. For example, a PMOS device has an inverse polarity to an NMOS device.

In another exemplary scheme for operating the semiconductor device 200, the positive control voltage may be applied to both control conductors 230, 232 simultaneously when the semiconductor device 200 is in the on-state. In such examples, the first control conductor 230 may be electrically connected to, or even contiguous with, the second control conductor 232 within the semiconductor device 200. That is, the first control conductor 230 and the second control conductor 232 may be a single, unitary component.

The footprint of a semiconductor device, such as a power transistor, is in general determined by the resistance in the on-state and the reverse bias capability in off-state of the semiconductor device because a wider extension region area can be used to reduce the on resistance and a longer extension region can provide a higher reverse bias capability. By using one or both of the extension regions as an accumulation layer/region in the on-state, the on-resistance of the semiconductor device may be greatly reduced. The resistance of the accumulation layer can be inversely related to the voltage applied at the associated control conductor. Applying a higher voltage to the control conductor therefore results in a reduction in the resistance of the accumulation layer. The semiconductor device described with respect to FIG. 2, which has separate control conductors, can therefore be made much smaller than a device with a field plate layer that is electrically connected to the gate because the on-resistance can be reduced, as described above. Lowering the on-resistance by boosting the control conductor voltage can therefore have a substantial impact on the size of the transistor. Although extra space may be needed for a drive circuit that is capable of generating multiple drive voltages, the overall space requirement for the transistor circuit may still be reduced.

The first and second extension regions and field plate configurations can be either symmetric or asymmetric dependent on whether an associated application of the semiconductor device requires high voltage handling capabilities at a drain region only, or at both of interchangeable source and drain regions.

The boost-effect caused by the application of the field effect at the side acting as source can be even stronger than the boosting effect at the side acting as drain (because a source side series resistor reduces current drive more than a drain side series resistor). Results from a simulated device with an oxide thickness between control conductors and the substrate of 350 nm demonstrate a 20% drive improvement, that is, a 20% increase in current flow when the device is in the on-state due to the reduced resistance. A device with a thinner oxide layer between the control conductors and the substrate may provide an even better drive improvement.

Figure 3:
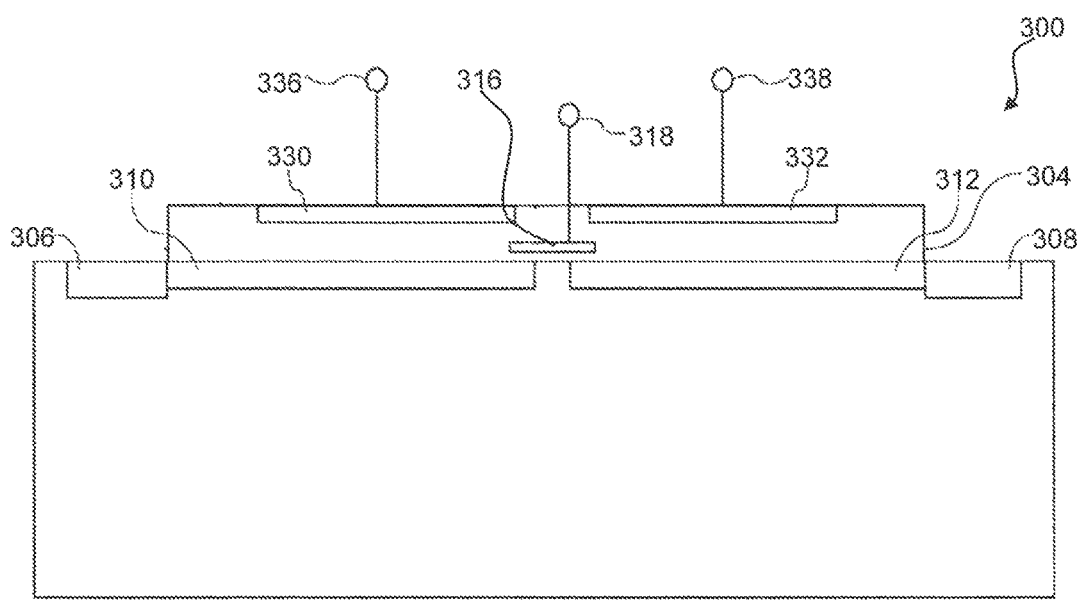

FIG. 3 illustrates a semiconductor device 300 similar to that of FIG. 2 in which the first and second control conductors 330, 332 are provided in a first layer of the terminal portion 304 and the gate conductor 316 is provided in a different, second layer. Corresponding series of reference numerals are used between figures to describe similar components. Components that have already been described with reference to an earlier figure will not necessarily be described again.

In this example, the gate conductor 316 is situated closer to a top surface of the substrate 302 than the first and second control conductors 330, 332. An advantage of providing the different layers for the gate and the control conductors 316, 330, 332 is that the voltage that can be applied to the gate conductor 316 can be increased compared to the case shown in FIG. 2 in which the gate and the control conductors 316, 330, 332 are provided in a single layer and so are in close proximity to one another. The overlap between the control conductors 330, 332 and the gate conductor 316 avoids a high Ohmic part in the extension (being not field effect induced accumulation). The arrangement of the control conductors 330, 332 and the gate conductor 316 in two separate layers can reduce the electric field peak at the edges of the control conductors 330, 332.

In general, each of the gate and the control conductors 316, 330, 332 may be provided by metal or poly-silicon material.

Figure 4:
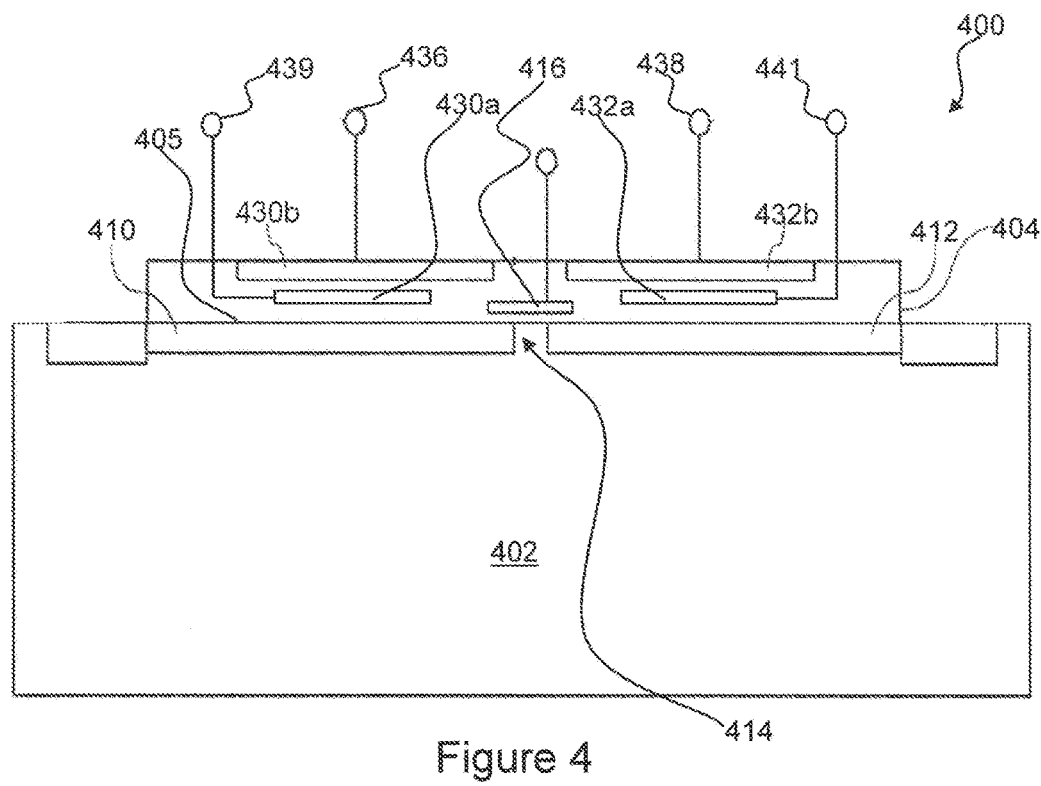

FIG. 4 illustrates a semiconductor device 400 similar to that of FIG. 3 in which the first and second control conductors each comprise an inner portion 430a, 432a and an outer portion 430b, 432b.

The first control terminal 436 is electrically connected to the outer portion 430b of the first control conductor and is configured to receive a first control voltage from an external component/source and provide the first control voltage to the first control conductor. The second control terminal 438 is electrically connected to the outer portion 432b of the second control conductor and is configured to receive a second control voltage from an external component/source and provide the second control voltage to the second control conductor. A third control terminal 439 is electrically connected to the inner portion 430a of the first control conductor and is configured to receive a third control voltage from an external component/source and provide the third control voltage to the first control conductor. A fourth control terminal 441 is electrically connected to the inner portion 432a of the second control conductor and is configured to receive a fourth control voltage from an external component/source and provide the fourth control voltage to the second control conductor. In this way, separate bias voltages can be applied to the inner and outer portions 430a, 432a, 430b, 432b of the respective control conductors. These bias voltages can be the same as one another or different from one another. For example, the first and third voltages may be equal or different and the second and fourth voltages may also be equal or different.

The inner portions 430a, 432a are closer to the surface 405 of the substrate 402 than the outer portions 430b, 432b. The inner portions 430a, 432a may be considered to be lower portions and the outer portions 430b, 432b may be considered to be upper portions. The outer portions 430b, 432b may be disposed on an outer surface of the connection terminal 404 and may be exposed to the exterior of the semiconductor device 400. The inner portions 430a, 432a are buried, that is fully enclosed, within insulating material of the connection terminal 404. The inner portions 430a, 432a in this example are smaller than the outer portions 430b, 432b, and when viewed from above, the footprint of each inner portion 430a, 432a is entirely contained within the footprint of its corresponding outer portion 430b, 432b reducing field peaks at the edges of the electrodes. The inner portions 430a, 432a have a similar thickness to as the gate conductor 416. A thicker oxide layer is provided between the inner portions 430a, 432a and the respective extension regions 410, 412 than between the gate connection 416 and the channel region 414. The provision of the thicker oxide layers between the inner portions 430a, 432a and the extension regions 410, 412 results in the electric fields at the edges of the inner portions 430a, 432a being reduced for a given applied voltage.

A first layer of insulating material is provided between each respective inner portion 430a, 432a and a corresponding extension region 410, 412. A second layer of insulating material is provided between each respective inner portion 430a, 432a and a corresponding outer portion 430b, 432b. The outer portions 430b, 432b may be provided by a different material to the inner portions 430a, 432a. For example, the outer portions 430b, 432b may comprise metal and the inner portions may comprise polysilicon.

Figure 5:
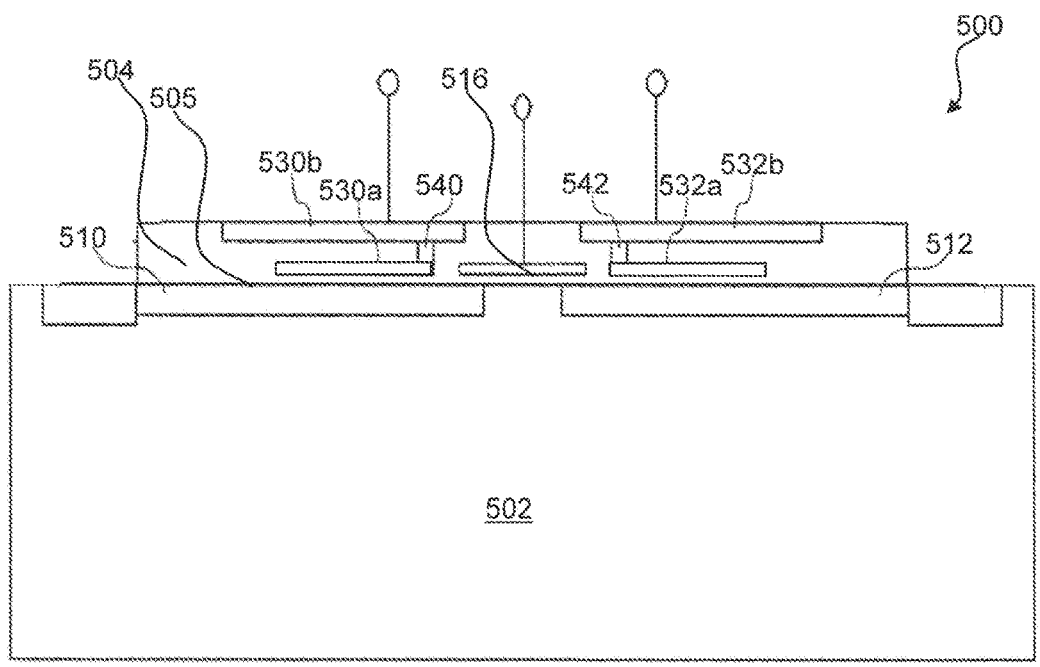

FIG. 5 illustrates a semiconductor device 500 similar to that of FIG. 4 and comprises optional vias 540, 542. A first via 540 is provided between the inner portion 530a and the outer portion 530b of the first control conductor. A second via 542 is provided between the inner portion 532a and the outer portion 532b of the second control conductor. In this example, the inner portions 530a, 532a of the first and second control conductors and the gate conductor 518 are provided by a single discontinuous layer of material, such as polysilicon. The semiconductor device 500 can provide a smooth transition in the electric field from the edges of the gate conductor 516 to the edges of the control conductors because the outer portions 530b, 532b overlap respective gaps between the inner portions 530a, 530b of the control conductors and the gate conductor 516. The relatively thick insulating layer between the outer portions 530b, 532b and the extension regions 510, 512 can avoid or reduce field peaks at edges of the portions 530b, 532b of the first and second control conductors and so can allow the device 500 to exhibit a higher breakdown voltage. That is, the outer portions 530b, 532b are spaced apart from the top surface 505 of the substrate 502 by a region of insulating material that is thicker than a region of insulating material between the inner portions 530a, 532a and the top surface 505 of the substrate 502.

Figure 6:
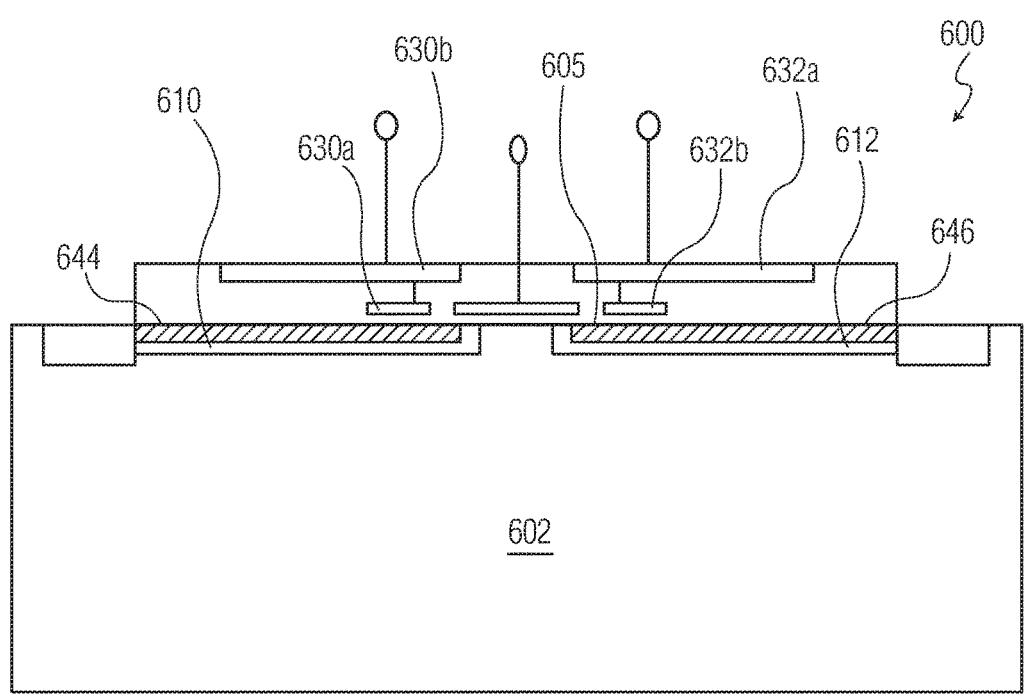

FIG. 6 illustrates a semiconductor device 600 similar to that of FIG. 5 in which a shallow trench termination (STI) or local oxidation of silicon (LOCOS) region 644, 646 is provided within each of the first and second extension regions 610, 612. The STI or LOCOS regions 644, 646 form as a barrier layer adjacent to the surface 605 of the substrate 602. The respective drift regions of the extension regions 610, 612 are provided below the STI LOCOS regions 644, 646. In this way the STI LOCOS regions 644, 646 separate the drift regions from the inner portions 630a, 632a of the first and second control conductors. STI or LOCOS increase the insulator thickness, which allows a smoother electric field to be provided at the edges of the control conductors. The STI or LOCOS therefore provides a graduated step in the field from poly(gate) to metal control conductor.

Figure 7A:
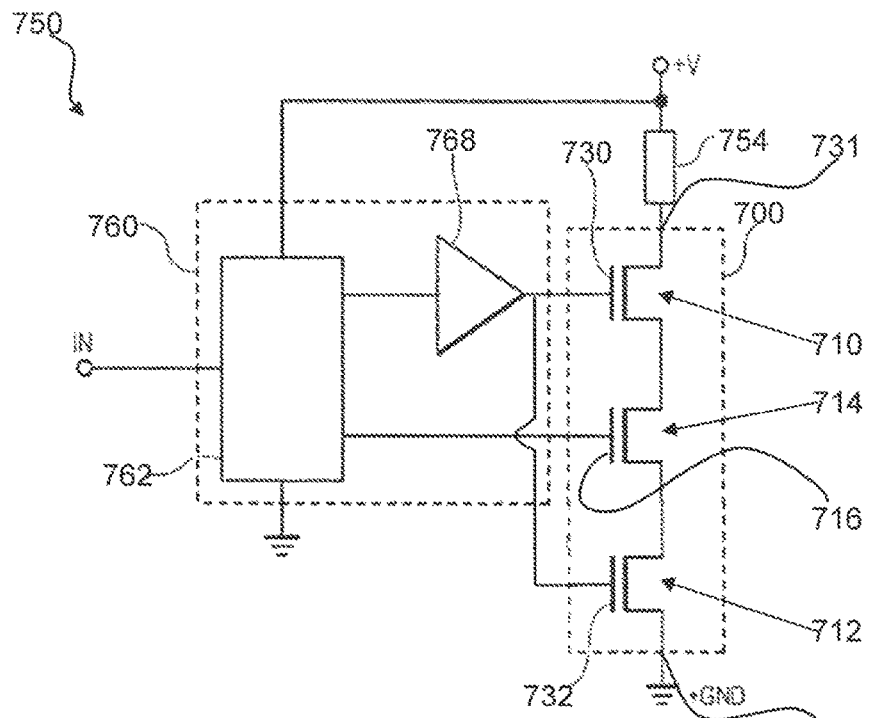
FIGS. 7a and 7b illustrate driver circuits for the semiconductor devices of FIGS. 2 to 6.
Figure 7B:
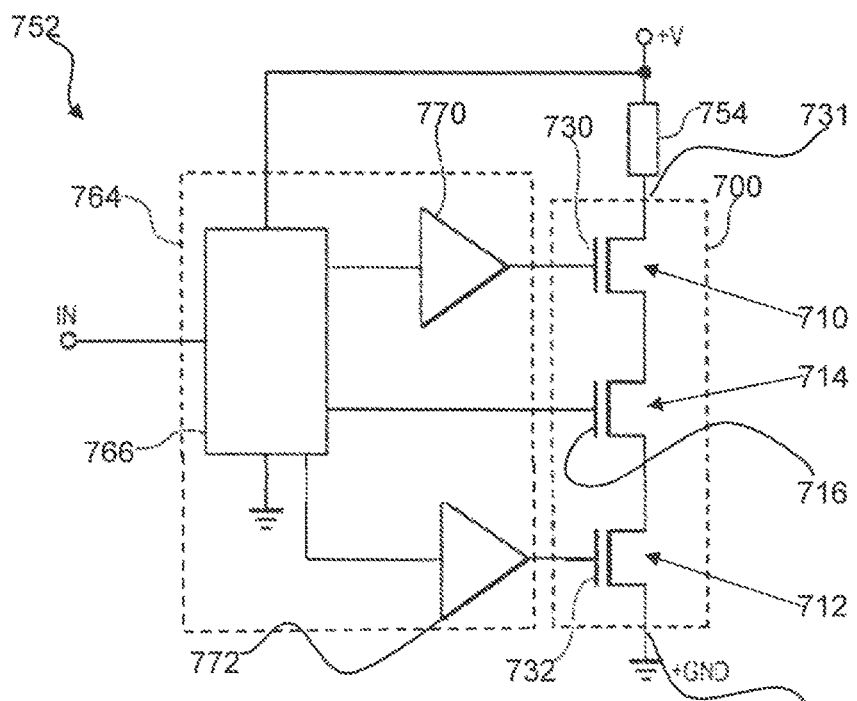

FIGS. 7a and 7b illustrate block diagrams of circuits 720, 721 for driving a semiconductor device 700 similar to the semiconductor devices described with reference to FIGS. 2 to 6. The circuits include a driver circuit 760, 764. The semiconductor device 700 is shown modelled as three separate FETs, with gate terminals of the respective FETs representing connections to the first control conductor 730, the gate conductor 716 and the second control conductor 732. The conduction channels of the respective FETs represent the first extension region 710, the gate channel region 714 and the second extension region 712. The conduction channels of the three FETs are connected in series between a first region terminal 731 and a second region terminal 733.

In the same way as discussed above, the first and second control conductors 730, 732 are configured to control conduction in respective first and second extension regions 710, 712 using the field effect. The gate conductor 716 is configured to control conduction in the gate channel region 714 using the field effect. The first extension region 730 is connected to the first region terminal 731 and the second extension region 732 is connected to the second region terminal 733. The first region terminal 731 is connected to a voltage source +V via a load 754. The second region terminal is connected to ground. It will be appreciated that the polarity of the first and second region terminals 731, 733 may be reversed.

The driver circuit 760 can be implemented in the same integrated circuit (IC) chip as the semiconductor device 700 in order to save IC space. Alternatively, the driver circuit 760 can be implemented in a separate IC chip from the semiconductor device 700, which may be desirable for safety reasons in some applications.

FIG. 7a illustrates a drive circuit 762 for providing a common control signal to the first and second control conductors 730, 732 in accordance with an input signal IN. The driver circuit 760 includes a gate steering logic circuit 762 and an optional amplifier 768. The amplifier 768 is configured to receive a control signal from the driver circuit 760 and provide an appropriate signal to drive the first and second control conductors 730, 732. The gate steering logic circuit 762 is also configured to provide a drive signal for the gate conductor 716.

FIG. 7b illustrates a drive circuit 764 for providing independent control signals to the first and second control conductors 730, 732 in accordance with an input signal IN. The driver circuit 764 includes a gate steering logic circuit 766, an optional first amplifier 770 and an optional second amplifier 772. The first amplifier 770 is configured to drive the first control conductor 730. The second amplifier 772 is configured to drive the second control conductor 732. The first and second control conductors 730, 732 can be driven separately, or independently from one another, in this example. The gate steering logic circuit 766 is also configured to drive the gate conductor 716.

The gate steering logic circuit 766 of FIG. 7b may be configured to determine which of the first and second control conductors 730, 732 relates to the drain extension region and which relates to the source extension region, that is, to determine the polarity of the device. The gate steering logic circuit 766 may perform this determination by comparing a voltage at the first region terminal 731 to a voltage at the second region terminal 733. The gate steering logic circuit 766 may apply a different voltage to the source control conductor to the drain control conductor.

For example, the gate steering logic circuit 766 may be configured to, in an on-state of the device:
  apply a first polarity gate voltage to the gate conductor 716;
  apply a first polarity control voltage, which is larger than the gate voltage, to the control conductor this is determined to be associated with the source region; and
  apply one of the following to the control conductor that is determined to be associated with the drain region: (i) a second polarity voltage, where the first polarity opposes the second polarity; (ii) a ground voltage; or (iii) zero voltage.

The gate steering logic circuit 766 may compare the voltages at the first and second terminals 731, 733 continuously or discontinuously in order to reassess the polarity of the semiconductor device 700. The discontinuous comparison may be periodic.

In another example, the gate steering logic circuit 766 may be configured to, in an on-state of the device:
  apply a first polarity gate voltage to the gate conductor 716;
  apply a first polarity control voltage, which is larger than the gate voltage, to both the first and second control conductors 730, 732.

Figure 8:
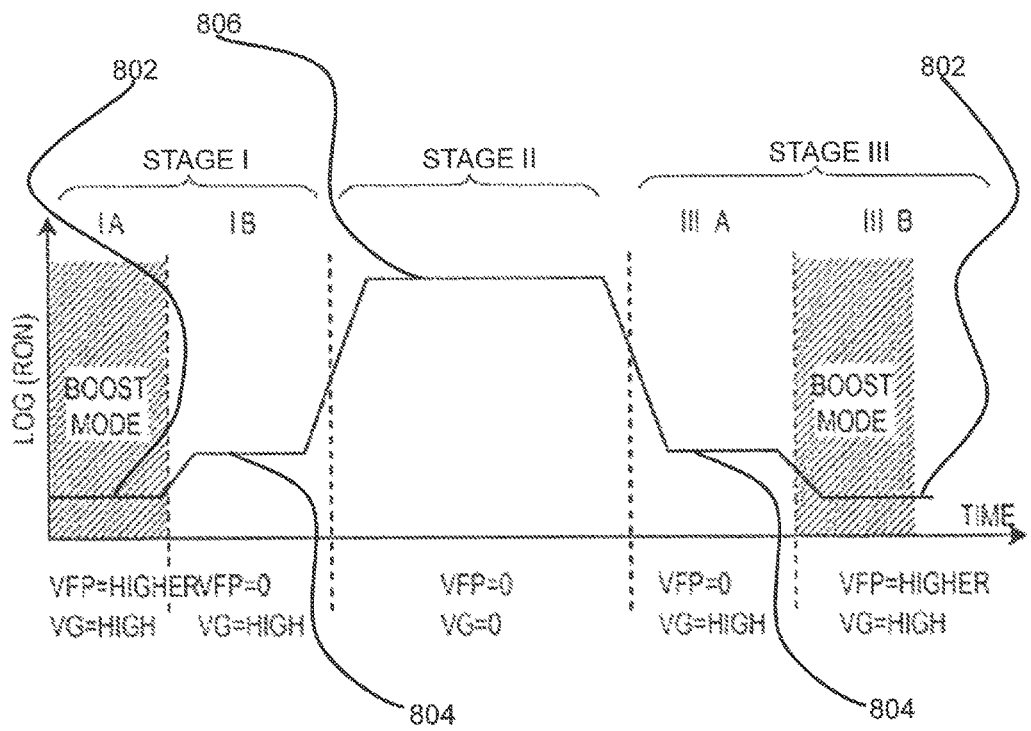
FIG. 8 illustrates an on-resistance profile for a semiconductor device that is similar to those shown in FIGS. 2 to 6 driven by the driver circuit of FIG. 7a or 7b.

FIG. 8 illustrates how the resistance of a semiconductor device similar to that of FIG. 2 varies during an on-off-on cycle of the device. The vertical axis in FIG. 8 represents the on-resistance of the semiconductor device. The horizontal axis in FIG. 8 represents time, which is divided into stages I, II, and III. The semiconductor device is on during stages I and III, and is off during stage II.

When the semiconductor device operates in the boost mode, in which either the source or the drain control voltage or both applied to the respective control conductor is high, the resistance of the semiconductor device is reduced or low.

Stage I includes two sub-stages IA and IB. In sub-stage IA, the semiconductor device is in a boost mode. In particular, a drain control voltage VFP applied to the drain control conductor is higher than the gate voltage VG applied to the gate conductor. Consequently, the resistance of the semiconductor device is low, at a first level 802. In sub-stage IB, the drain control voltage VFP applied to the drain control conductor is set to zero and the resistance of the semiconductor device increases to a second level 804 that is higher than the first level 802.

In stage II, the semiconductor device is turned off and the gate voltage VG applied to the gate conductor and the drain control voltage applied VFP to the drain control conductor are set to zero (or negative). Consequently, the resistance of the semiconductor device increases from the second level 804 to a higher third level 806.

Stage III includes two sub-stages IIIA and IIIB. In sub-stage IIIA, the drain control voltage VFP applied to the drain control conductor is set to zero (or negative) and the resistance of the semiconductor device falls from the third level 806 to the second level 804. In sub-stage IIIB, the semiconductor device 200 is in a boost mode. The drain control voltage applied to the drain control conductor is higher than the voltage applied to the gate conductor, and consequently, the resistance of the semiconductor device 200 is lowered to the first level 802.

The source control conductor can be controlled in a similar way to the drain control conductor.

The semiconductor devices described herein may be provided as part of a semiconductor IC chip that is included in a power device for automobile or lighting applications, or in a computing device, such as a smartphone, a tablet computer, a laptop, etc. The semiconductor device may include an n-channel metal-oxide-semiconductor (NMOS) device or a p-channel metal-oxide-semiconductor (PMOS) device, which can have inverted doping and voltage levels compared to an NMOS device.

Figure 9:
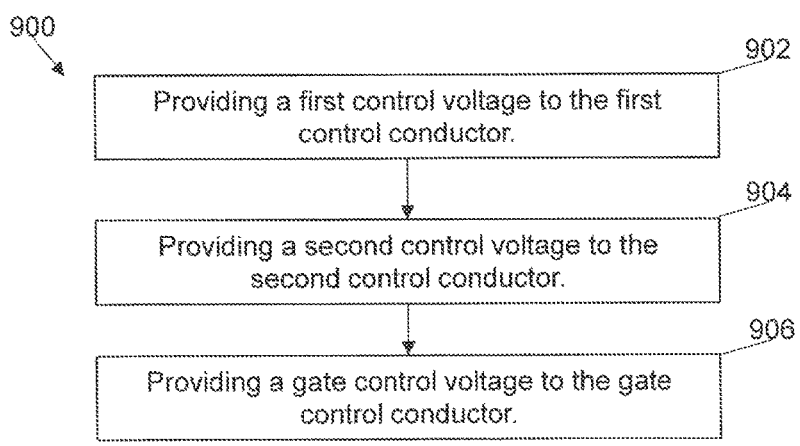
FIG. 9 illustrates a method of operating a semiconductor device.

FIG. 9 illustrates a method 900 of operating a semiconductor device such as the devices described with reference to FIGS. 2 to 6. The method 900 comprises providing, at step 902, a first control voltage to the first control conductor; providing, at step 904, a second control voltage to the second control conductor; and providing, at step 906, a gate control voltage to the gate control conductor. As discussed above, such control can advantageously enable the on-resistance of the device to be adequately low irrespective of which way around the semiconductor device is biased It will be appreciated that any components that are described or illustrated herein as being coupled or connected could be directly or indirectly coupled or connected. That is, one or more components could be located between two components that are said to be coupled or connected whilst still enabling the required functionality to be achieved.

Throughout the present specification, the descriptors relating to relative orientation and position, such as "horizontal", "vertical", "top", "bottom" and "side", are used in the sense of the orientation of the semiconductor device as presented in the drawings. However, such descriptors are not intended to be in any way limiting to an intended use of the described or claimed invention.

The invention claimed is:

1. A semiconductor device comprising:
a substrate having:
a first terminal region;
a second terminal region;
a first extension region that extends from the first terminal region towards the second terminal region;
a second extension region that extends from the second terminal region towards the first terminal region;
a channel region between the first and second extension regions;
a gate conductor that overlies the channel region of the substrate, the gate conductor configured to control conduction in the channel region;
a first control conductor comprising an inner portion and an outer portion separated vertically from each other by an insulating layer, wherein the first control conductor overlies at least a portion of the first extension region, the first control conductor configured to control conduction in the first extension region; and
a second control conductor comprising an inner portion and an outer portion separated vertically from each other by an insulating layer, wherein the second control conductor overlies at least a portion of the second extension region, the second control conductor configured to control conduction in the second extension region,
wherein the first and second control conductors are electrically isolated within the semiconductor device from the gate conductor;
wherein the inner portions of the first control conductor and the second control conductor are enclosed within insulation material and the outer portions of the first control conductor and the second control conductor are exposed to an exterior of the semiconductor device; and
wherein the first control conductor has a control terminal electrically connected to the inner portion and a separate control terminal electrically connected to the outer portion and the second control conductor has a control terminal electrically connected to the inner portion and a separate control terminal electrically connected to the outer portion.

2. The semiconductor device of claim 1, wherein the first control conductor is electrically isolated from the second control conductor within the semiconductor device.

3. The semiconductor device of claim 1, wherein the substrate has a plane of symmetry that passes through a center of the channel region.

4. The semiconductor device of claim 1, wherein the gate conductor overlies the channel region, a periphery of the first extension region and a periphery of the second extension region.

5. The semiconductor device of claim 1, wherein the gate conductor and the first and second control conductors are made of a same material.

6. The semiconductor device of claim 1, wherein the first and second control conductors are made from a different material than that of the gate conductor.

7. The semiconductor device of claim 1, wherein the first and second control conductors each include a polysilicon layer, a metal layer, and a via connecting the polysilicon layer to the metal layer.

8. The semiconductor device of claim 1, wherein the semiconductor device is a transistor.

9. A circuit comprising:
the semiconductor device of claim 1; and
a driver circuit configured to provide:
a first control voltage to the first control conductor;
a second control voltage to the second control conductor; and
a gate control voltage to the gate conductor.

10. A capacitive voltage converter comprising the semiconductor device of claim 1.

11. The semiconductor device of claim 1, wherein a footprint of each inner portion of the first and second control conductor is entirely contained within a footprint of each corresponding outer portion of the first and second control conductor when viewed from above.

12. The semiconductor device of claim 1, wherein the outer portions of the first and second control conductors overlap respective gaps between the inner portions of the first and second control conductors and the gate conductor.

13. The semiconductor device of claim 7, wherein the respective polysilicon layers of the first and second control conductors comprise upper portions of the first and second control conductors, the respective metal layers of the first and second control conductors comprise lower portions of the first and second control conductors, and wherein the polysilicon layer at least partially overlies the metal layer.

14. The circuit of claim 9 wherein the first control voltage is the same as the second control voltage.

15. The circuit of claim 9 wherein the first control voltage is independent of the second control voltage.

16. The circuit of claim 9, wherein the driver circuit is further configured to:
set the first control voltage to be higher than the gate control voltage during an on-state of the semiconductor device; and
set the first control voltage to one of (i) zero, (ii) a negative value or (iii) a lower voltage than the gate control voltage during an off state of the semiconductor device.

17. The circuit of claim 9, wherein the driver circuit comprises a gate steering logic circuit that is configured to:
compare a first measured voltage at a first region of the semiconductor device with a second measured voltage at a second region of the semiconductor device;
determine a polarity of the semiconductor device, based on which of the first and second control conductors is associated with a source extension region and which is associated with a drain extension region, in accordance with the comparison; and
set the first and second control voltages for the first and second control conductors in accordance with a state of the semiconductor device and/or the polarity of the semiconductor device.

18. The capacitive voltage converter as recited in claim 10, further comprising,
a driver circuit configured to provide:
a first control voltage to the first control conductor;
a second control voltage to the second control conductor; and
a gate control voltage to the gate conductor.

* * * * *